United States Patent
Bi

(10) Patent No.: US 11,812,593 B2
(45) Date of Patent: Nov. 7, 2023

(54) METHOD FOR HEAT DISSIPATION CONTROL OF CHARGING BASE, AND TERMINAL DEVICE

(71) Applicant: BEIJING XIAOMI MOBILE SOFTWARE CO., LTD., Beijing (CN)

(72) Inventor: Jiangang Bi, Beijing (CN)

(73) Assignee: BEIJING XIAOMI MOBILE SOFTWARE CO., LTD., Beijing (CN)

( * ) Notice: Subject to any disclaimer, the term of this patent is extended or adjusted under 35 U.S.C. 154(b) by 53 days.

(21) Appl. No.: 17/461,242

(22) Filed: Aug. 30, 2021

(65) Prior Publication Data
US 2022/0312650 A1    Sep. 29, 2022

(30) Foreign Application Priority Data
Mar. 25, 2021 (CN) .......................... 202110330503.5

(51) Int. Cl.
  H05K 7/20 (2006.01)
  G05B 15/02 (2006.01)
  H02J 7/00 (2006.01)
(52) U.S. Cl.
  CPC ......... *H05K 7/20945* (2013.01); *G05B 15/02* (2013.01); *H02J 7/00034* (2020.01); *H02J 7/0044* (2013.01); *H05K 7/20172* (2013.01); *H05K 7/20909* (2013.01); *H02J 7/00309* (2020.01)
(58) Field of Classification Search
  USPC ....................................................... 700/300
  See application file for complete search history.

(56) References Cited

U.S. PATENT DOCUMENTS

| 2017/0168531 A1* | 6/2017 | Casparian ............... G06F 1/206 |
| 2017/0172009 A1* | 6/2017 | Wang ..................... G06F 1/1632 |
| 2020/0383235 A1* | 12/2020 | Yu ......................... H02J 7/0047 |

FOREIGN PATENT DOCUMENTS

| CN | 210603615 U | 5/2020 |
| CN | 112152304 A | 12/2020 |

OTHER PUBLICATIONS

European Patent Application No. 21194062.2 Search and Opinion dated Jul. 15, 2022, 8 pages.

\* cited by examiner

*Primary Examiner* — Emilio J Saavedra
(74) *Attorney, Agent, or Firm* — COZEN O'CONNOR

(57) ABSTRACT

A method for heat dissipation control of a charging base is applied to a terminal device, and includes: receiving a trigger message configured to represent a wireless communication connection between the terminal device and the charging base; displaying an interaction interface for heat dissipation control according to the trigger message; and sending a control instruction corresponding to the selection information to the charging base based on selection information generated in response to acting on the interaction interface for heat dissipation control. An apparatus for heat dissipation control of a charging base, a terminal device and a charging base for charging the terminal device are also disclosed.

13 Claims, 7 Drawing Sheets

METHOD FOR HEAT DISSIPATION CONTROL OF CHARGING BASE, AND TERMINAL DEVICE

CROSS REFERENCE TO RELATED APPLICATIONS

This application claims priority to Chinese Patent Application No. 202110330503.5, filed on Mar. 25, 2021, the content of which is incorporated herein by reference in its entirety.

TECHNICAL FIELD

The present disclosure relates to wireless charging technologies, and particularly to a method and an apparatus for heat dissipation control of a charging base, a terminal device, a charging base and a medium.

BACKGROUND

Computing devices such as mobile phones and tablets have become an indispensable part in people's work and life. When a user frequently uses a computing device in situations where it is not plugged into a power source, the battery power may be insufficient resulting in a need to charge the computing device.

A charging device supporting a computing device includes a wireless charging device and a wired charging device. Compared with a wireless charging device, a wired charging device is poor in compatibility and universality because connectors must be matched between the wire and the device. The wireless charging device is charged in an electromagnetic induction mode with better compatibility, which is more favored by people.

With the rapid development of wireless charging technologies, the power of the wireless charging device is increasing. This causes the temperature of the wireless charging device to increase more quickly and the heat output to become large in the charging process, which easily damages internal components and leads to poor user experiences.

SUMMARY

According to a first aspect of the present disclosure, a method for heat dissipation control of a charging base is applied to a terminal device, and includes: receiving a trigger message configured to represent a wireless communication connection between the terminal device and the charging base; displaying an interaction interface for heat dissipation control according to the trigger message; and sending a control instruction corresponding to the selection information to the charging base based on selection information generated in response to acting on the interaction interface for heat dissipation control.

According to a second aspect of the present disclosure, a method for heat dissipation control of a charging base is applied to a charging base including a fan. The charging base is connected to a terminal device through wireless communication. The method includes receiving a control instruction sent by the terminal device; and controlling the fan based on the control instruction to dissipate heat at a rotation rate corresponding to the control instruction.

According to a third aspect of the present disclosure, a terminal device includes a first communication module, a control chip and a first charging chip. The first communication module may be electrically connected to the control chip and the first charging chip. A wireless communication connection is established between the terminal device and a charging base through the first communication module. The first charging chip may be configured to determine that the wireless communication connection is established in response to placing the terminal device into the charging base and send a trigger message for representing the wireless communication connection to the control chip. The control chip may be configured to receive the trigger message and control a display screen to display an interaction interface for heat dissipation control and send a control instruction corresponding to selection information to the charging base based on the selection information generated in response to acting on the interaction interface for heat dissipation control. It should be noted that, the details above and in the following are exemplary and illustrative, and do not constitute the limitation on the present disclosure.

BRIEF DESCRIPTION OF THE DRAWINGS

The drawings herein are incorporated into the specification and constitute a part of the specification, show embodiments in conformity with embodiments of the present disclosure, and explain the principle of the present disclosure together with the specification.

DETAILED DESCRIPTION

Figure 1:
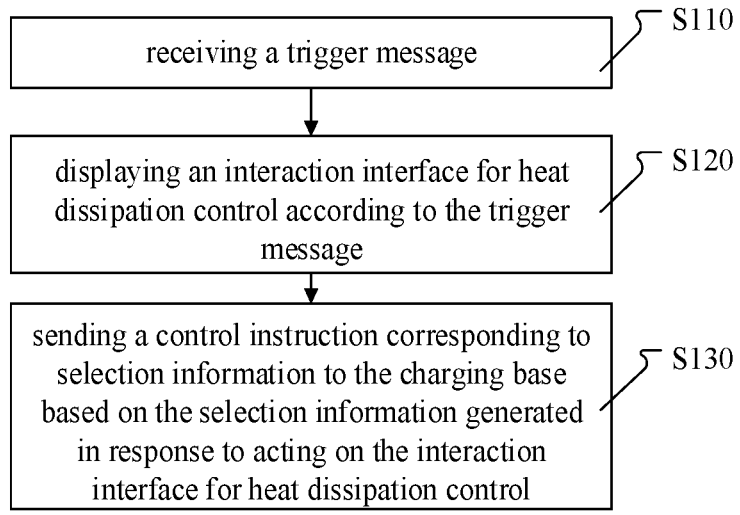
FIG. 1 is a flowchart illustrating a method for heat dissipation of a charging base according to an example embodiment.

The example embodiments will be described in detail here, and examples thereof are shown in the accompanying drawings. When the following descriptions refer to the accompanying drawings, unless otherwise indicated, the same numbers in different drawings represent the same or similar elements. The implementations described in the following example embodiments do not represent all the implementations consistent with the present invention. Rather, they are merely examples of the apparatuses and methods consistent with some aspects of the present invention as recited in the appended claims.

In the related art, in order to solve the problem of increasing the temperature of the charging base, a fan is added inside the charging base. When a wireless charging device charges a terminal device, the fan dissipates heat in the wireless charging device, which prevents the temperature from rising quickly and affecting the performance of the wireless charging device. This effectively reduces potential safety hazards.

In the related art, there is an implementation where the fan in the charging base has a constant rotation rate. When the charging base charges the terminal device at a large charging power, the temperature rise is fast. The current heat dissipation requirement may not be met since the fan is operated at the constant rotation rate. When the current charging power of the charging base is small, the temperature rise is slow. Resource waste may occur since the fan is operated at the constant rotation rate.

In the related art, there is another implementation where the fan has a variable rotation rate. When the charging base charges the terminal device, the charging base may control the rotation rate of the fan according to the magnitude of charging power. However, the control mode of the fan in the scheme is not user-friendly. The user may not manually adjust the rotation rate of the fan according to his or her own preferences, which may not meet the charging requirements of the user. Furthermore, when the charging base charges the terminal device at a large power, the fan dissipates heat at a large power with a loud noise, which may not be adjusted by the user at this time and leads to poor user experiences.

The present disclosure provides a method for heat dissipation control of a charging base, which is applied to a terminal device. The method for heat dissipation control of a charging base includes: receiving a trigger message configured to represent a wireless communication connection between the terminal device and the charging base; displaying an interaction interface for heat dissipation control according to the trigger message; sending a control instruction corresponding to the selection information to the charging base based on selection information acting on the interaction interface for heat dissipation control. According to the method of the present disclosure, when a charging base is connected to a terminal device through wireless communication, the interaction interface for heat dissipation control configured to control a charging base is displayed on the terminal device for users to select, so that the fan of the charging base may be rotated according to the user's requirements.

In an example embodiment, the method for heat dissipation control of a charging base is applied to a terminal device. The terminal device is for example, a mobile phone, a tablet computer, etc. The terminal device includes a display screen, a control chip and a first charging chip, and a first communication module electrically connected to the control chip and the first charging chip. The control chip may control the display chip and the first charging chip. The terminal device may establish the wireless communication connection with the charging base through the first communication module, to implement information data transmission. The first communication module is for example, a near field communication (NFC), etc. It should be noted that, the NFC module may be integrated on a single chip to implement the functions of inductive card readers, inductive cards and point-to-point communication.

As illustrated in FIG. 1, the method for heat dissipation control of the charging base in the embodiment includes the following steps.

At S110, a trigger message configured to represent a wireless communication connection between the terminal device and the charging base is received.

At this step, the trigger message is for example, a message that a wireless communication connection is established between the terminal device and the charging base.

When the user places the terminal device in the charging base, the first charging chip determines that the terminal device is in a wireless charging mode, then it is determined that the terminal device establishes a wireless communication connection with the charging base, and the first charging chip sends a message to the control chip, the message indicating the wireless communication connection between the terminal device and the charging base.

At S120, an interaction interface for heat dissipation control is displayed according to the trigger message.

At this step, the control chip receives the trigger message and controls the display screen of the terminal device to display the interaction interface for heat dissipation control, and the user views the interaction interface for heat dissipation control through the display screen.

At S130, a control instruction corresponding to selection information is sent to the charging base based on the selection information. The selection information is generated in response to acting on the interaction interface for heat dissipation control.

At this step, the user may select according to the interaction interface for heat dissipation control displayed in the display screen, and the control chip obtains touch selection information acting on the interaction interface for heat dissipation control by the user. The control chip sends a control instruction corresponding to the selection information to the charging base based on selection information in the interaction interface for heat dissipation control, to implement the control of the charging base.

The selection information acting on the interaction interface for heat dissipation control may be for example, a plurality of virtual buttons displayed on the interaction interface for heat dissipation control. Users may complete the selection of functions on the interaction interface for heat dissipation control by touching the corresponding virtual buttons.

For another example, a plurality of virtual buttons are displayed on the interaction interface for heat dissipation control. The users input the name of the button to be selected by voice, and the control chip may determine the user's selection according to voice information to complete the selection of functions of the interaction interface for heat dissipation control.

In the method of the embodiment, the control instruction corresponding to the selection information is sent to the charging base based on selection information acting on the interaction interface for heat dissipation control. According to the display content on the interaction interface for heat dissipation control, the charging base may be controlled at a rational rotation rate of a fan by the user to wirelessly charge the terminal device. The charging base is controlled according to the user's requirements, which improves the user experiences.

In an example embodiment, the method for heat dissipation of a charging base is applied to a terminal device. The terminal device is for example, a mobile phone, a tablet computer, etc. The terminal device includes a display screen, a control chip and a first charging chip, and a first communication module electrically connected to the control chip and the first charging chip.

Figure 2:
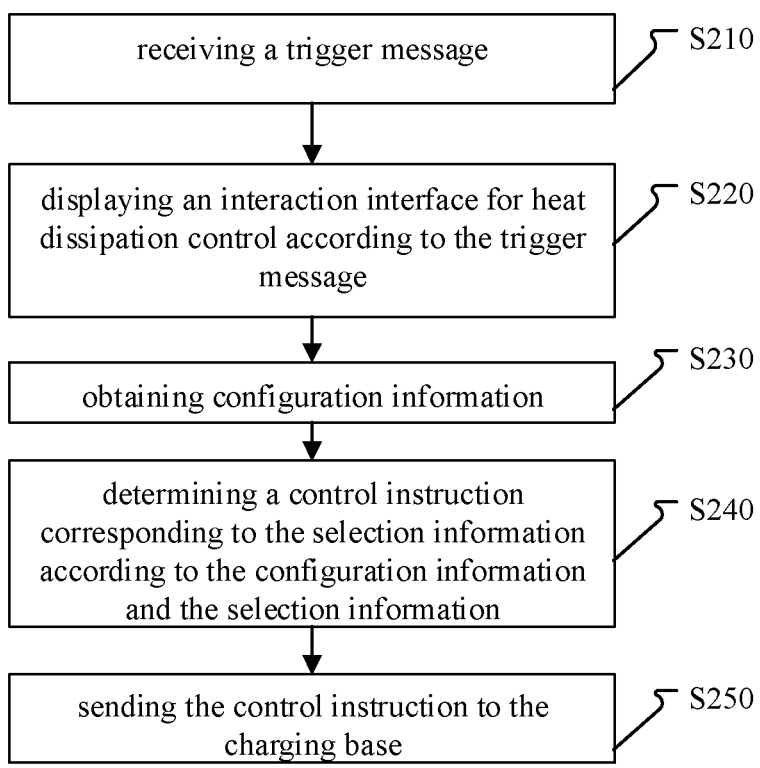
FIG. 2 is a flowchart illustrating a method for heat dissipation of a charging base according to an example embodiment.

As illustrated in FIG. 2, the method for heat dissipation control of the charging base in the embodiment includes the following steps.

At S210, a trigger message configured to represent a wireless communication connection between the terminal device and the charging base is received.

At S220, an interaction interface for heat dissipation control is displayed according to the trigger message.

The implementation of S210 and S220 is same as that of S110 and S120, which is not repeated here.

At S230, configuration information is obtained.

At this step, the configuration information is configured to represent a corresponding relationship between pieces of selection information and control instructions.

In an example, the selection information is generated in response to selecting by the user a rotation gear of the fan of the charging base on the display interface, and the configuration information may store a corresponding relationship between the rotation gear of the fan of the charging base and the control instruction. For example, when a rotation gear indicating 0% to 50% of the rotation rate of the fan is selected, it corresponds to a control instruction for low speed rotation; and when a rotation gear indicating 50% to 100% of the rotation rate of the fan is selected, it corresponds to a control instruction for high speed rotation.

In another example, the selection information is generated in response to selecting by the user a charging power of the charging base on the display interface, and the configuration information may be stored in advance for representing a corresponding relationship between the charging power of the charging base and the control instruction. For example, when the charging power of the charging base is 0 W to 30 W which represents a slow charging mode, it corresponds to a control instruction for low speed rotation, and when the charging power of the charging base is 30 W to 66 W which represents a fast charging mode, it corresponds to a control instruction for high speed rotation.

At S240, a control instruction corresponding to the selection information is determined according to the configuration information and the selection information.

At this step, the control chip receives the selection information acting on the interaction interface for heat dissipation control, and the control instruction corresponding to the current selection information may be retrieved in the configuration information in a search or traverse manner.

In an example, different fixed rotation rate values may be set in the configuration information, the different fixed rotation rate values including all integers in 0 to 100, and each fixed rotation rate value corresponding to a control instruction. For example, when the rotation rate value is 0, the corresponding is 0% of the rotation rate of the fan; when the rotation rate value is 100, the corresponding is 100% of the rotation rate of the fan.

The user may select a corresponding fixed rotation rate value according to the requirement, and the control chip of the terminal device receives the selection information and determines a control instruction corresponding to the selection information according to the selection information and the configuration information to accurately control the rotation state of the fan of the charging base, which further improves the user experiences.

At S250, a control instruction is sent to a charging base.

At this step, after the control chip determines a corresponding control instruction, the control instruction is sent to a charging base.

It should be noted that, in the above embodiment, the rotation rate interval and the corresponding control instruction, the rotation rate and the corresponding control instruction, and the charging power and the corresponding control instruction are only example descriptions, which does not limit the scope of the disclosure.

In the method of the embodiment, the configuration information is preconfigured, and a control instruction corresponding to the selection information is rapidly determined according to the configuration information and the selection information, which enhances the control efficiency of the charging base.

The present disclosure further provides a method for heat dissipation control of a charging base. The method is applied to a charging base including a fan, the charging base being connected to a terminal device through wireless communication. The charging base receives a control instruction of the terminal device to control the fan to dissipate heat at a rotation rate corresponding to the control instruction, to meet the user requirements.

In an example embodiment, the method for heat dissipation of a charging base is applied to a charging base. The charging base is for example, a wireless charging device. The terminal device establishes a wireless communication connection with a charging base including a fan and a second charging chip, and a second communication module electrically connected to the second charging chip. The charging base may establish a wireless communication connection with the terminal device with the second communication module, to implement information data transmission. The second communication module is for example, a near field communication (NFC), etc.

Figure 3:
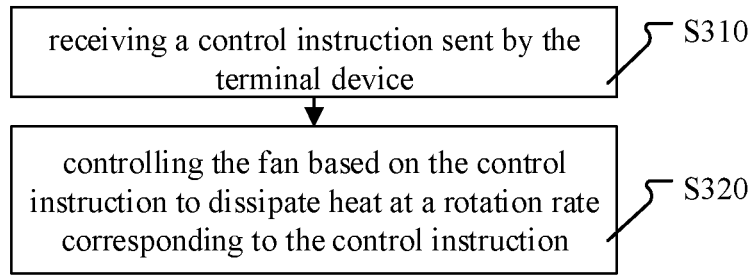
FIG. 3 is a flowchart illustrating a method for heat dissipation of a charging base according to an example embodiment.

As illustrated in FIG. 3, the method for heat dissipation control of the charging base in the embodiment includes the following steps.

At S310, a control instruction sent by the terminal device is received.

At this step, the second charging chip of the charging base establishes a wireless communication connection with the first charging chip of the terminal device, and the second charging chip may receive the control instruction sent by the control chip of the terminal device through the first charging chip.

The control instruction is determined by the terminal device according to the trigger information or the voice information of the user acting on the terminal device, and in combination with the configuration information stored in the terminal device. Furthermore, since the control instruction in the embodiment is a private control instruction with a preset function, the private control instruction may be added in the existing QI protocol to ensure control reliability and accuracy. In the process of transmitting the control instruction, the control instruction includes, for example, a preset data packet, the format of which is such as AA BB X0Y0 X1Y1 Checksum. The control instruction actually transmitted in the preset data packet is X0Y0 and X1Y1, each byte being defined as hexadecimal, and the range of each byte being 00 00~FF FF.

In an example, the control instruction actually transmitted in the preset data packet is, for example, a Y0 bit in the X0Y0 byte, and the Y0 bit is defined as lower four bits 0~10 for controlling the rotation rate of the fan. When the Y0 bit is defined as F, it represents that the charging base restores a default configuration of the fan. Other bytes may be user-defined.

At this step, after receiving the preset data packet, the second charging chip may perform check and verification and send a feedback message to the first charging chip. The feedback message is, for example, an acknowledgement character (ACK) or a negative acknowledgement (NAK) character. For example, when the second charging chip receives a correct preset data packet, the feedback message carries an ACK identifier; when the second charging chip receives a wrong preset data packet, the feedback message carries an NAK identifier.

At S320, the fan is controlled based on the control instruction to dissipate heat at a rotation rate corresponding to the control instruction.

At this step, the second charging chip controls the fan based on the control instruction received by the second charging chip to dissipate heat at a rotation rate corresponding to the control instruction.

In the method of the embodiment, the second charging chip of the charging base executes the control instruction sent by the terminal device to control a rotation rate of the fan of the charging base, to meet the user requirements.

In an example embodiment, the method for heat dissipation of a charging base is applied to a charging base. The terminal device establishes a wireless communication connection with a charging base including a fan and a second charging chip, and a second communication module electrically connected to the second charging chip. The charging base may establish the wireless communication connection with the terminal device through the second communication module.

Figure 4:
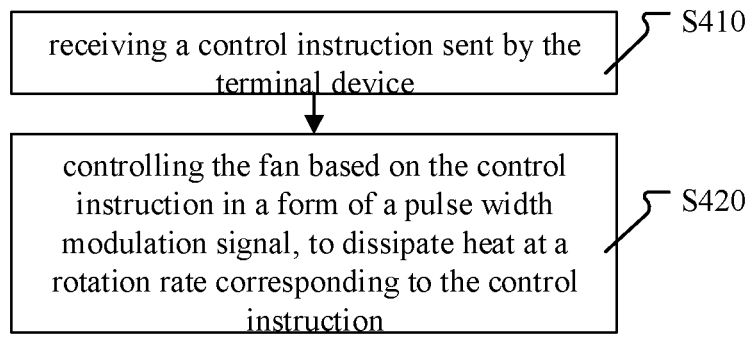
FIG. 4 is a flowchart illustrating a method for heat dissipation of a charging base according to an example embodiment.

As illustrated in FIG. 4, the method for heat dissipation control of the charging base includes:

At S410, a control instruction sent by the terminal device is received.

At S420, the fan is controlled based on the control instruction in a form of a pulse width modulation signal, to dissipate heat at a rotation rate corresponding to the control instruction.

At this step, the control instruction is transmitted in the form of a pulse width modulation signal with a strong anti-noise ability, to ensure reliability and stability of signal transmission.

It may be understood that the preset data packet for transmitting the control instruction in the form of a pulse width modulation signal may be take other forms as long as the control instruction may be successfully transmitted between the terminal device and the charging base, which will not be limited here.

In an example embodiment, the method for heat dissipation of a charging base is applied to a charging base. The terminal device establishes a wireless communication connection with a charging base including a fan and a second charging chip, and a second communication module electrically connected to the second charging chip. The charging base may establish the wireless communication connection with the terminal device through the second communication module.

Figure 5:
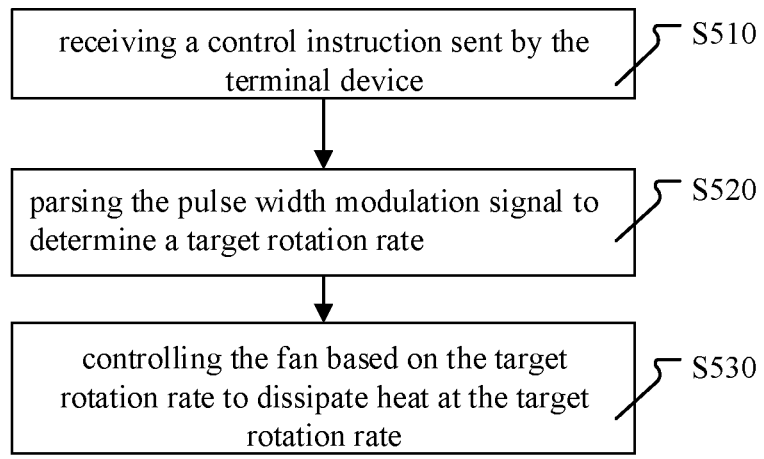
FIG. 5 is a flowchart illustrating a method for heat dissipation of a charging base according to an example embodiment.

As illustrated in FIG. 5, the method for heat dissipation control of the charging base includes:

At S510, a control instruction sent by the terminal device is received.

At S520, the pulse width modulation signal is parsed to determine a target rotation rate.

At this step, the pulse width modulation signal is parsed, that is, the preset data packet is parsed to determine the target rotation rate included in the preset data packet.

At S530, the fan is controlled based on the target rotation rate to dissipate heat at the target rotation rate.

The second charging chip controls the fan to dissipate heat at the target rotation rate after parsing the target rotation rate included in the preset data packet at S530.

In the method of the embodiment, the pulse width modulation signal is parsed to determine the target rotation rate, which enhances the adjustment speed of the fan and improves the user experiences. In the charging process, the user may select a rotation rate of the fan of the charging base through the interaction interface for heat dissipation interface in the terminal device. When the user selects the fan operated at a full speed, the terminal device may implement rapid charging. When the user wants to charge in a less noisy manner, the user may select a half speed mode or a mute mode to implement the requirement of mute charging. The control right of adjusting the charging rate is transferred to the user to enhance the intelligence of wireless charging and make wireless charging more user-friendly.

In an example embodiment, the terminal device is for example, a mobile phone, a tablet computer, etc. The terminal device includes a control chip, a first charging chip and a display screen. The charging base is for example, a wireless charging device, and the charging base includes a second charging chip and a fan.

Figure 6:
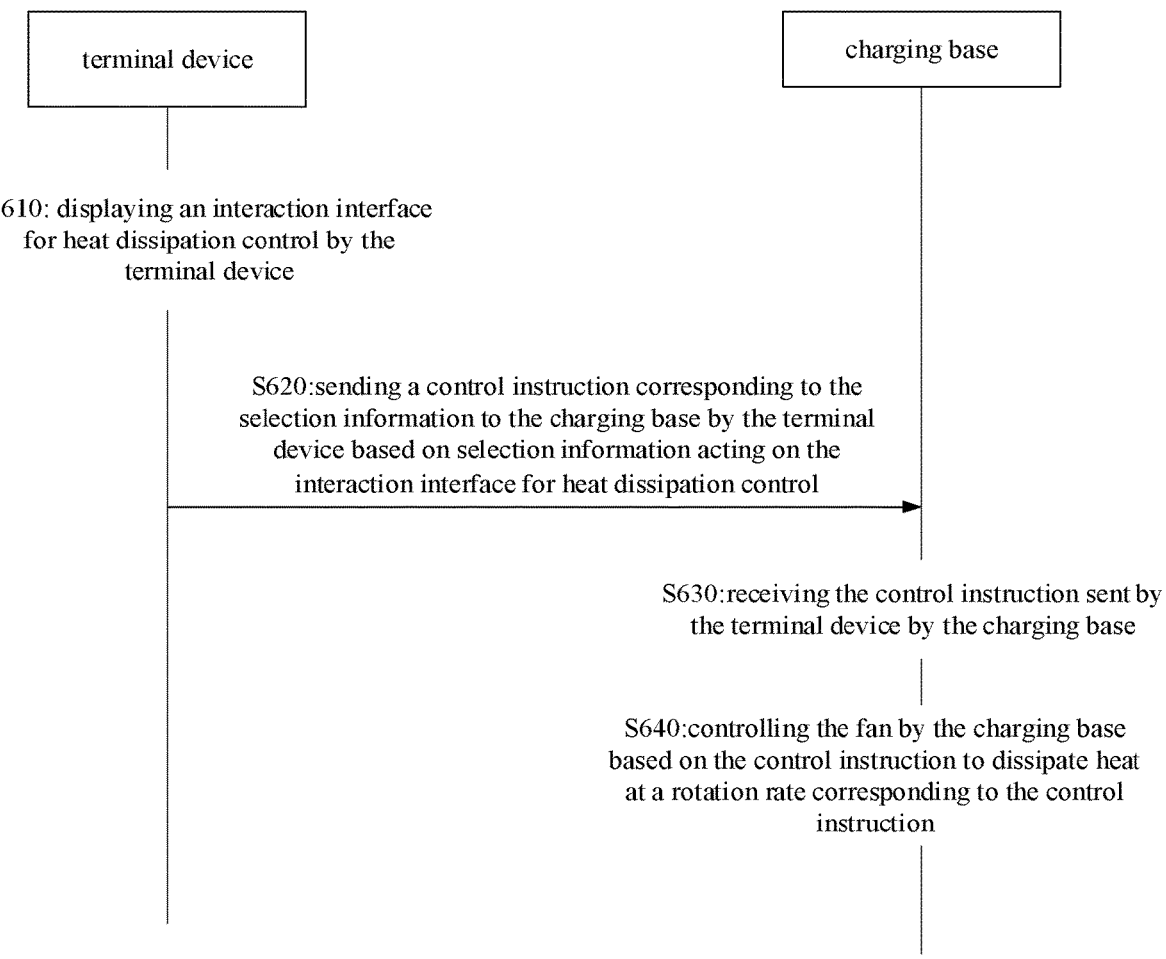
FIG. 6 is a flowchart illustrating a method for heat dissipation of a charging base according to an example embodiment.

FIG. 6 illustrates an interaction process of a terminal device and a charging base. A wireless communication connection has been established between a terminal device and a charging base. The interaction process of the terminal device and the charging base includes the following steps.

At S610, the terminal device displays an interaction interface for heat dissipation control.

At S620, the terminal device sends a control instruction corresponding to the selection information to the charging base based on selection information acting on the interaction interface for heat dissipation control.

At S630, the charging base receives the control instruction sent by the terminal device.

At S640, the charging base controls the fan based on the control instruction to dissipate heat at a rotation rate corresponding to the control instruction.

In an example embodiment, the terminal device is for example, a mobile phone, a tablet computer, etc. The terminal device includes a control chip, a first charging chip and a display screen. The charging base is for example, a wireless charging device, and the charging base includes a second charging chip and a fan.

Figure 7:
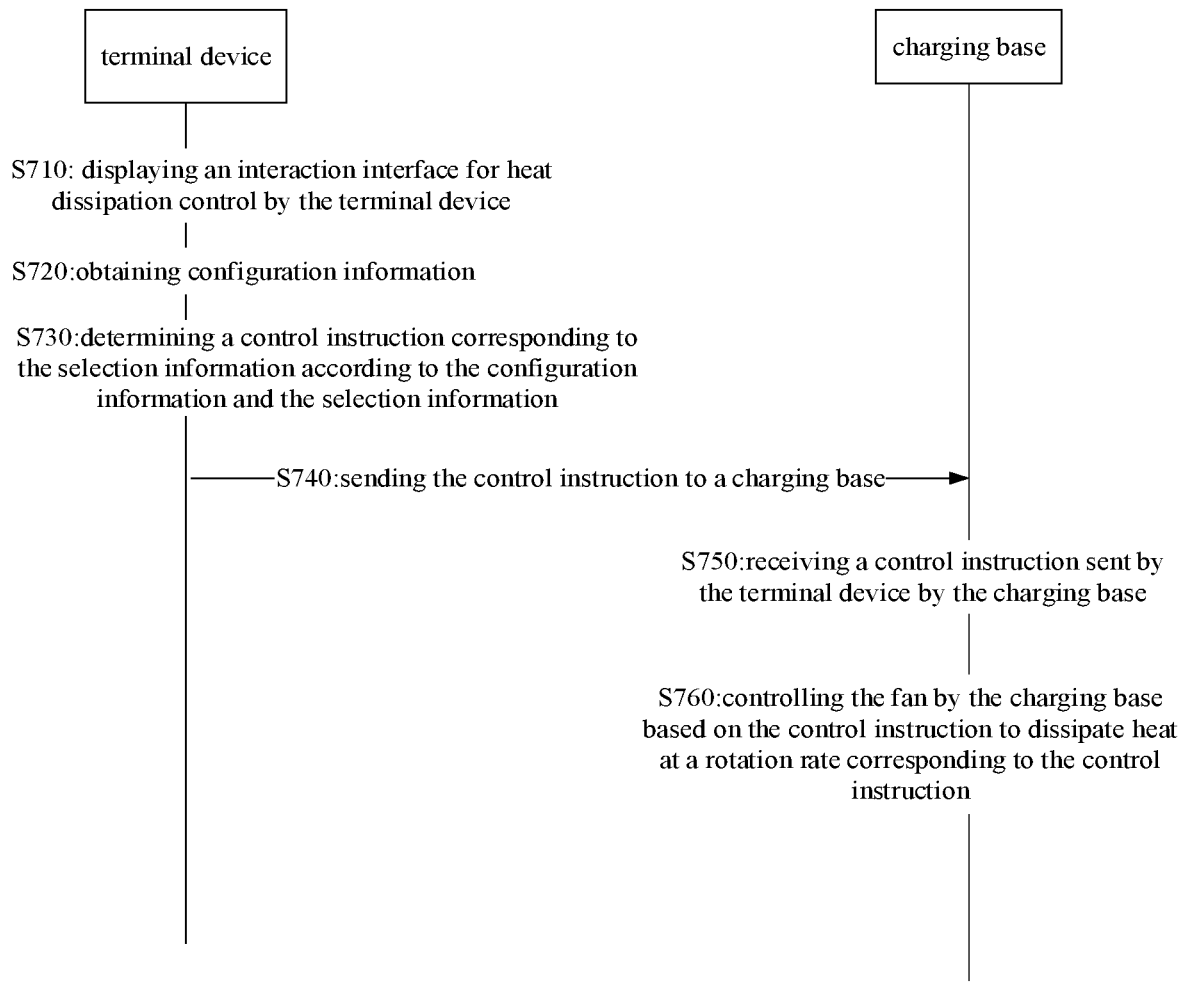
FIG. 7 is a flowchart illustrating a method for heat dissipation of a charging base according to an example embodiment.

FIG. 7 illustrates an interaction process of a terminal device and a charging base. A wireless communication connection has been established between a terminal device and a charging base. The interaction process of the terminal device and the charging base includes the following steps.

At S710, the terminal device displays an interaction interface for heat dissipation control.

At S720, configuration information is obtained.

At S730, a control instruction corresponding to the selection information is determined according to the configuration information and the selection information.

At S740, a control instruction is sent to a charging base.

At S750, the charging base receives the control instruction sent by the terminal device.

At S760, the charging base controls the fan based on the control instruction to dissipate heat at a rotation rate corresponding to the control instruction.

In an example embodiment, the terminal device is for example, a mobile phone, a tablet computer, etc. The terminal device includes a control chip, a first charging chip and a display screen. The charging base is for example, a wireless charging device, and the charging base includes a second charging chip and a fan.

Figure 8:
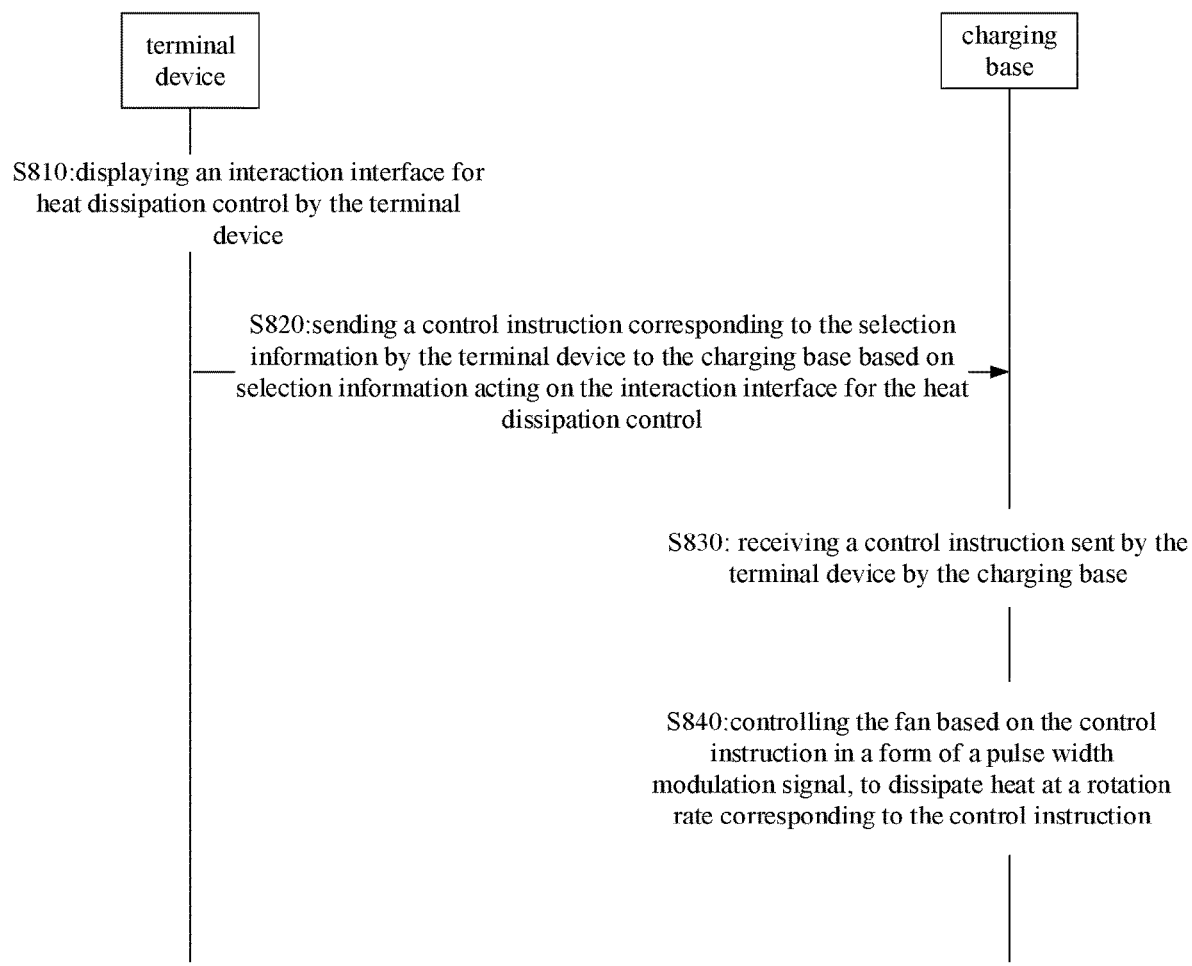
FIG. 8 is a flowchart illustrating a method for heat dissipation of a charging base according to an example embodiment.

FIG. 8 illustrates an interaction process of a terminal device and a charging base. A wireless communication connection has been established between a terminal device and a charging base. The interaction process of the terminal device and the charging base includes the following steps.

At S810, the terminal device displays an interaction interface for heat dissipation control.

At S820, the terminal device sends a control instruction corresponding to the selection information to the charging base based on selection information acting on the interaction interface for heat dissipation control.

At S830, the charging base receives the control instruction sent by the terminal device.

At S840, the fan is controlled based on the control instruction in a form of a pulse width modulation signal, to dissipate heat at a rotation rate corresponding to the control instruction.

In an example embodiment, the terminal device is for example, a mobile phone, a tablet computer, etc. The terminal device includes a control chip, a first charging chip and a display screen. The charging base is for example, a wireless charging device, and the charging base includes a second charging chip and a fan.

Figure 9:
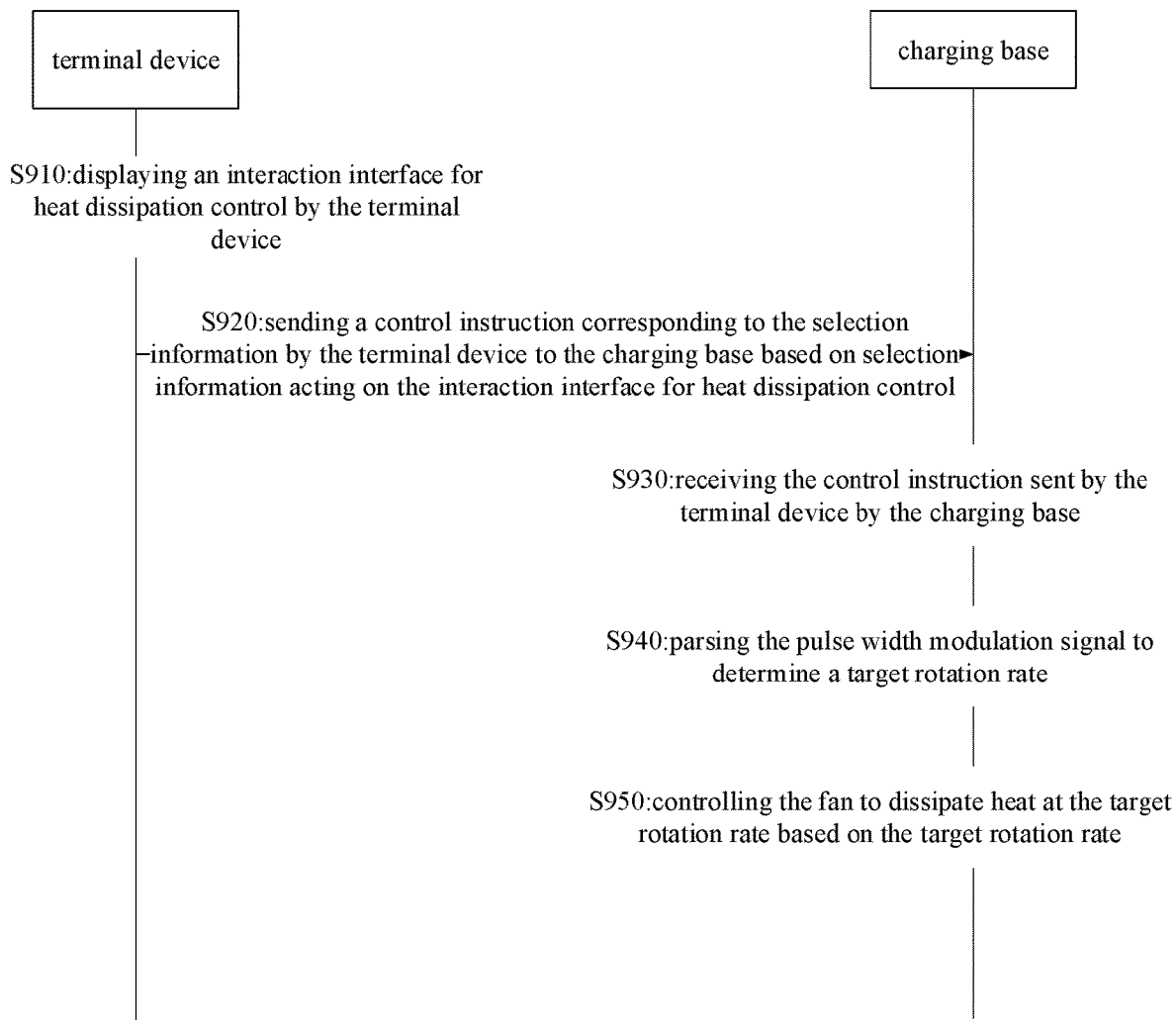
FIG. 9 is a flowchart illustrating a method for heat dissipation of a charging base according to an example embodiment.

FIG. 9 illustrates an interaction process of a terminal device and a charging base. A wireless communication connection has been established between a terminal device and a charging base. The interaction process of the terminal device and the charging base includes the following steps.

At S910, the terminal device displays an interaction interface for heat dissipation control.

At S920, the terminal device sends a control instruction corresponding to the selection information to the charging base based on selection information acting on the interaction interface for heat dissipation control.

At S930, the charging base receives the control instruction sent by the terminal device.

At S940, the pulse width modulation signal is parsed to determine a target rotation rate.

At S950, the fan is controlled to dissipate heat at the target rotation rate based on the target rotation rate.

The present disclosure provides an apparatus for heat dissipation control of a charging base, which is applied to a terminal device.

Figure 10:
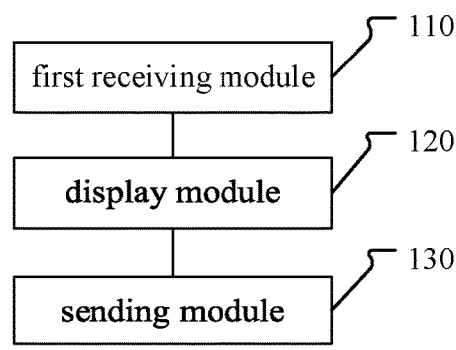
FIG. 10 is a block diagram illustrating an apparatus for heat dissipation of a charging base according to an example embodiment.

In an example embodiment, as illustrated in FIG. 10, the control apparatus in the embodiment includes a first receiving module 110, a display module 120 and a sending module 130. The apparatus in the embodiment is configured to implement the method as illustrated in FIG. 1. In the implementation process, the first receiving module 110 is configured to receive a trigger message configured to represent a wireless communication connection between the terminal device and the charging base. The display module 120 is configured to display an interaction interface for heat dissipation control according to the trigger message. The sending module 130 is configured to send a control instruction corresponding to the selection information to the charging base based on selection information acting on the interaction interface for heat dissipation control.

The control instruction is sent to the charging base through the interaction interface for heat dissipation control in the terminal device, and the user may make selective adjustments to improve the intelligence of the charging base.

In an example embodiment, as illustrated in FIG. 10, the control apparatus in the embodiment includes a first receiving module 110, a display module 120 and a sending module 130. The apparatus in the embodiment is configured to implement the method as illustrated in FIG. 2. In the implementation process, the sending module 130 is configured to obtain configuration information; determine a control instruction corresponding to the selection information according to the configuration information and the selection information; and send the control instruction to the charging base.

The present disclosure further provides an apparatus for heat dissipation control of a charging base. The apparatus is applied to a charging base including a fan, the charging base being connected to a terminal device through wireless communication.

Figure 11:
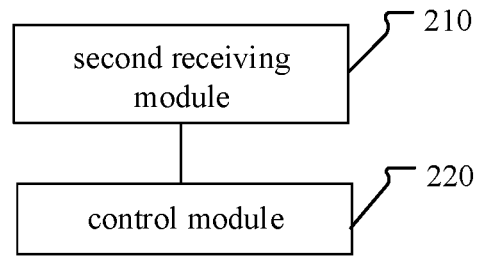
FIG. 11 is a block diagram illustrating an apparatus for heat dissipation of a charging base according to an example embodiment.

In an example embodiment, as illustrated in FIG. 11, the control apparatus in the embodiment includes a second receiving module 210 and a control module 220. The apparatus in the embodiment is configured to implement the method as illustrated in FIG. 3. In the implementation process, the second receiving module 210 is configured to receive a control instruction sent by the terminal device. The control module 220 is configured to control the fan based on the control instruction to dissipate heat at a rotation rate corresponding to the control instruction. The charging base may receive the control instruction sent by the terminal device to adjust the rotation rate of the fan, which solves the shortage of being unable to manually adjust the rotation rate of the fan.

In an example embodiment, as illustrated in FIG. 11, the control apparatus in the embodiment includes a second receiving module 210 and a control module 220. The apparatus in the embodiment is configured to implement the method as illustrated in FIG. 4. In the implementation process, the control module 220 is configured to control the fan based on the control instruction in a form of a pulse width modulation signal, to dissipate heat at a rotation rate corresponding to the control instruction.

In an example embodiment, as illustrated in FIG. 11, the control apparatus in the embodiment includes a second receiving module 210 and a control module 220. The apparatus in the embodiment is configured to implement the method as illustrated in FIG. 5. In the implementation process, the control module 220 parses the pulse width modulation signal to determine a target rotation rate and controls the fan based on the target rotation rate to dissipate heat at the target rotation rate.

Figure 12:
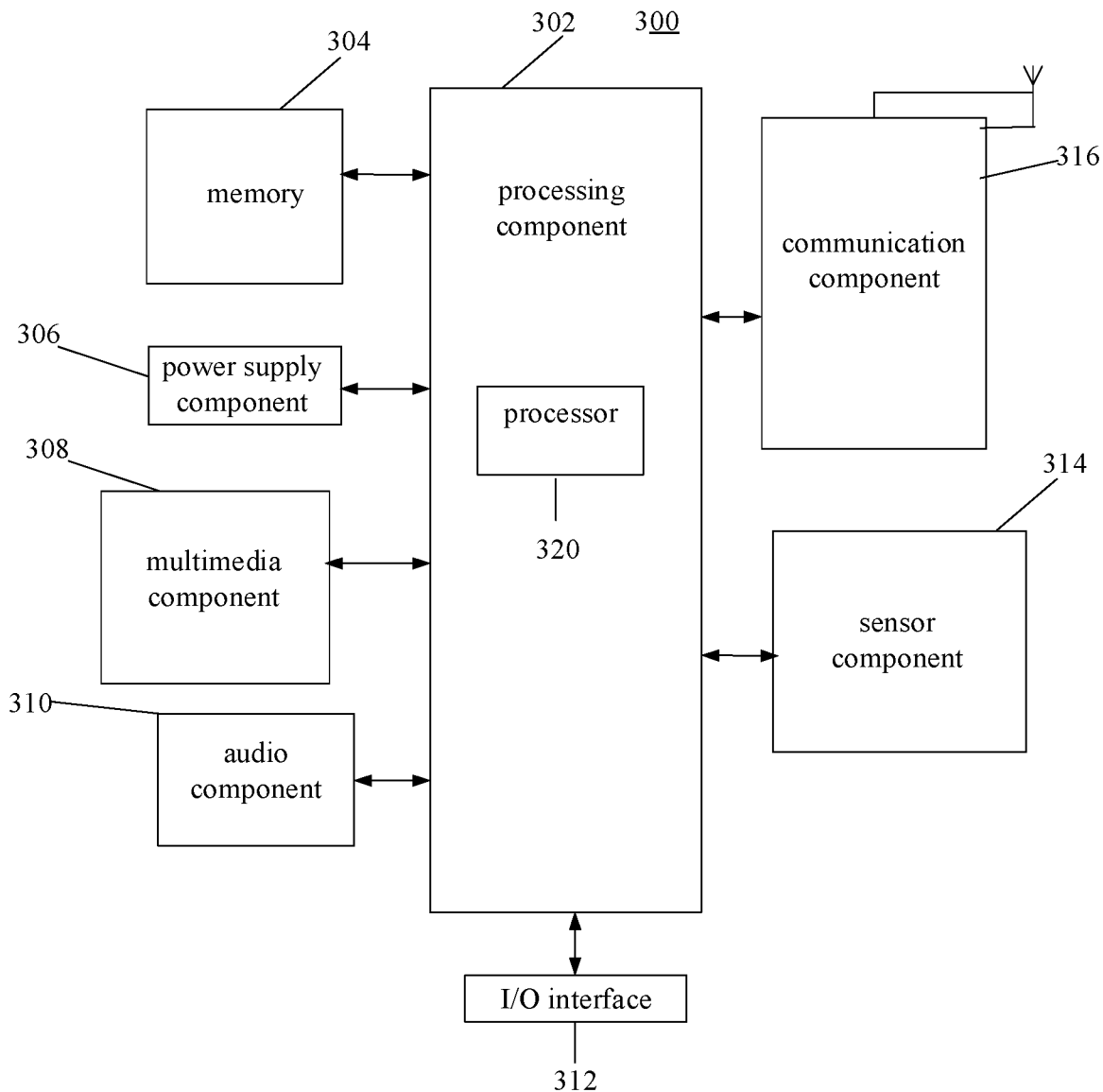
FIG. 12 is a block diagram illustrating an electronic device according to an example embodiment.

FIG. 12 is a block diagram of an electronic device. The present disclosure provides an electronic device including a processor and a memory configured to store instructions executable by the processor. The electronic device may be configured as a terminal device when executing the method for heat dissipation control of a charging base as illustrated in FIG. 1 to FIG. 2. The electronic device may be configured as a charging base when executing the method for heat dissipation control of a charging base as illustrated in FIG. 3 to FIG. 5.

The electronic device 300 may include one or more components: a processing component 302, a memory 304, an electrical component 306, a multimedia component 308, an audio component 310, an input/output (I/O) interface 312, a sensor component 314, and a communication component 316.

The processing component 302 generally controls the whole operation of the electronic device 300, such as the operations related to displays, phone calls, data communication, camera operations and recording operations. The processing component 302 may include one or more processors 320 to perform instructions, to complete all or part of steps of the above method. In addition, the processing component 302 may include one or more modules for the convenience of interactions between the processing component 302 and other components. For example, the processing component 302 may include a multimedia module for the convenience of interactions between the multimedia component 308 and the processing component 302.

The memory 304 is configured to store various types of data to support the operation of the electronic device 300. Examples of such data include the instructions of any applications or methods operated on the electronic device 300, contact data, phone book data, messages, pictures, videos, etc. The memory 304 may be implemented by any type of volatile or non-volatile storage devices or their combination, such as a static random-access memory (SRAM), an electrically erasable programmable read-only memory (EEPROM), an erasable programmable read-only memory (EPROM), a programmable read-only memory (PROM), a read-only memory (ROM), a magnetic memory, a flash memory, a magnetic disk or an optical disk.

The power supply component 306 may provide power for various components of the electronic device 300. The electrical component 306 may include a power supply management system, one or more power supplies, and other components related to generating, managing and distributing power for the device 300.

The multimedia component 308 includes a screen that provides an output interface screen provided between the electronic device 300 and the user. In some embodiments, a screen may include a liquid crystal display (LCD) and a touch panel (TP). When the screen includes a touch panel, the screen may be implemented as a touch screen to receive input signals from the user. The touch panel includes one or more touch sensors to sense touching, sliding and gestures on the touch panel. The touch sensor may not only sense the boundary of touching or sliding operation, but also detect the duration and pressure related to the touching or sliding operation. In some embodiments, the multimedia component 308 includes a front camera and/or a rear camera. When the electronic device 300 is in operation mode, such as shooting mode or video mode, the front camera or the rear camera may receive external multimedia data. Each of the front camera and rear camera may be a fixed optical lens system or an optical lens system with focal length and optical zoom capacity.

The audio component 310 is configured as output and/or input signals. For example, the audio component 310 includes a microphone (MIC). When the electronic device 300 is in operation mode, such as a call mode, a recording mode, and a speech recognition mode, the microphone is configured to receive external audio signals. The audio signals received may be further stored in the memory 304 or sent via the communication component 316. In some embodiments, the audio component 310 further includes a speaker configured to output an audio signal.

The I/O interface 312 provides an interface for the processing component 302 and the peripheral interface module, and the peripheral interface module may be a keyboard, a click wheel, a button, etc. The buttons may include but not limited to a home button, a volume button, a start button and a lock button.

The sensor component 314 includes one or more sensors, configured to provide various aspects of state evaluation for the electronic device 300. For example, the sensor component 314 may detect an on/off state of the electronic device 300 and the relative positioning of the component. For example, the component is a display and a keypad of the electronic device 300. The sensor component 314 may further detect a location change of the electronic device 300 or a component of the electronic device 300, a presence or absence of user contact with the device 300, an orientation or an acceleration/deceleration of the device 300, and a temperature change of the device 300. The sensor component 314 may include a proximity sensor, which is configured to detect the presence of the objects nearby without any physical contact. The sensor component 314 may further include a light sensor such as CMOS or CCD image sensor, which is configured to use in imaging applications. In some embodiments, the sensor component 314 may further include an acceleration transducer, a gyroscope sensor, a magnetic sensor, a pressure sensor or a temperature sensor.

The communication component 316 is configured for the convenience of wire or wireless communication between the electronic device 300 and other devices. The electronic device 300 may access wireless networks based on communication standard, such as WiFi, 2G or 3G, or their combination. In an exemplary embodiment, the communication component 316 receives broadcast signals or broadcast-related information from an external broadcast management system via a broadcast channel. In an exemplary embodiment, the communication component 316 further includes a near field communication (NFC) module to facilitate short-range communication. For example, the NFC module may be implemented based on a radio frequency identification (RFID) technology, an infrared data association (IRDA) technology, an ultra-wideband (UWB) technology, a bluetooth (BT) technology and other technologies.

In an example embodiment, the electronic device 300 may be implemented by one or more application specific integrated circuits (ASIC), digital signal processors (DSP), digital signal processing devices (DSPD), programmable logic devices (PLD), field programmable gate arrays (FPGA), controllers, microcontrollers, microprocessors or other electronics components, which is configured to perform the above method.

In an exemplary embodiment, a non-transitory computer readable storage medium is further provided, such as the memory 304 including instructions, in which the instructions is caused to be executed by the processor 320 of the electronic device 300 to complete the above methods. For example, the computer readable storage medium may be a ROM, a random access memory (RAM), a CD-ROM, a magnetic tape, a floppy disk, an optical data storage device, etc. A terminal device may execute a method as described in FIG. 1 to FIG. 2 when instructions in the storage medium are executed by the processor of an electronic device. A charging base may execute a method as described in FIG. 3 to FIG. 5 when instructions in the storage medium are executed by the charging base.

After considering the specification and practicing the disclosure herein, those skilled in the art will easily think of other implementations. The present application is intended to cover any variations, usages, or adaptive changes of the present disclosure. These variations, usages, or adaptive changes follow the general principles of the present disclosure and include common knowledge or conventional technical means in the technical field not disclosed by the present disclosure. The description and the embodiments are to be regarded as exemplary only, and the true scope and spirit of the present disclosure are given by the appended claims.

It should be understood that the present invention is not limited to the precise structure described above and shown in the drawings, and various modifications and changes may be made without departing from its scope. The scope of the present application is only limited by the appended claims.

What is claimed is:

1. A method for heat dissipation control of a charging base, applied to a terminal device, comprising:
receiving a trigger message configured to represent a wireless communication connection between the terminal device and the charging base;
displaying an interaction interface for heat dissipation control according to the trigger message, wherein the interaction interface are provided with a plurality of virtual buttons, and each virtual button corresponds to a rotation speed interval of a fan in the charging base; and
in response to receiving selection of a target virtual button among the virtual buttons, generating target selection information corresponding to the target virtual button, wherein the target selection information indicates a target rotation speed interval of the fan;
sending a control instruction corresponding to selection information to the charging base, so that the charging base adjusts a rotation speed of the fan to the target rotation speed interval based on the target control instruction.

2. The method of claim 1, wherein, sending the target control instruction corresponding to the target selection information to the charging base comprises:
obtaining configuration information representing a corresponding relationship between pieces of selection information and control instructions;
determining the target control instruction corresponding to the target selection information according to the configuration information; and
sending the target control instruction to the charging base.

3. The method of claim 1, wherein each virtual button further corresponds to each charging power of the charging base.

4. The method of claim 3, wherein the control instruction includes a preset data packet in a form of a pulse width modulation signal.

5. A method for heat dissipation control of a charging base, applied to a charging base comprising a fan, the charging base being connected to a terminal device through wireless communication, comprising:
receiving a target control instruction sent by the terminal device, wherein the target control instruction corresponds to target selection information indicating a target rotation speed interval of the fan, the target selection information is generated by the terminal device in response to receiving selection of a target virtual button among virtual buttons provided on an interaction interface for heat dissipation control, and each virtual button corresponds to a rotation speed interval of the fan; and
controlling a rotation speed of the fan to the target rotation speed interval based on the target control instruction.

6. The method of claim 5, wherein, controlling the rotation speed of the fan based on the target control instruction comprises:
controlling the rotation speed of the fan based on the target control instruction in a form of a pulse width modulation signal.

7. The method of claim 6, wherein, controlling the rotation speed of the fan based on the target control instruction in a form of a pulse width modulation signal further comprises:
parsing the pulse width modulation signal to determine a target rotation rate; and
controlling the fan based on the target rotation rate to dissipate heat at the target rotation rate.

8. The method of claim 7, further comprising:
performing check and verification on the control instruction and sending a feedback message to the terminal device.

9. A terminal device, comprising:
a first communication module electrically connected to a control chip and a first charging chip, through which a wireless communication connection is established between the terminal device and a charging base;
the first charging chip, configured to determine that the wireless communication connection is established in response to placing the terminal device into the charging base, and send a trigger message for representing the wireless communication connection to the control chip; and
the control chip, configured to receive the trigger message and control a display screen to display an interaction interface for heat dissipation control, wherein the interaction interface are provided with a plurality of virtual buttons, and each virtual button corresponds to a rotation speed interval of a fan in the charging base,
in response to receiving selection of a target virtual button among the virtual buttons, generate target selection information corresponding to the target virtual button, wherein the target selection information indicates a target rotation speed interval of the fan, and
send a control instruction corresponding to selection information to the charging base, so that the charging base adjusts a rotation speed of the fan to the target rotation speed interval based on the target control instruction.

10. The terminal device of claim 9, wherein the control chip is further configured to:
obtain configuration information representing a corresponding relationship between pieces of selection information and control instructions;
determine the target control instruction corresponding to the target selection information according to the configuration information, and
send the target control instruction to the charging base.

11. The terminal device of claim 9, wherein each virtual button further corresponds to each charging power of the charging base.

12. The terminal device of claim 11, wherein the control instruction includes a preset data packet in a form of a pulse width modulation signal, and the pulse width modulation signal includes a target rotation rate.

13. The terminal device of claim 9, wherein the first communication module is connected to a second communication module included in the charging base to perform the wireless communication connection, so that a second charging chip in the charging base receives the control instruction from the second communication module and controls a fan in the charging base on the control instruction to dissipate heat at a rotation rate corresponding to the control instruction.

* * * * *